United States Patent [19]
Urban et al.

[11] Patent Number: 6,026,566
[45] Date of Patent: Feb. 22, 2000

[54] STENCILING METHOD AND APPARATUS FOR PC BOARD REPAIR

[75] Inventors: Paul Louis Urban, Cheraw, S.C.; Bernard L. Bensussan, Monroe, Conn.; Thomas A. Gordon, San Diego, Calif.

[73] Assignee: Cooper Industries, Inc., Houston, Tex.

[21] Appl. No.: 08/869,357

[22] Filed: Jun. 5, 1997

[51] Int. Cl.[7] ............................... H05K 3/34; B23P 19/00
[52] U.S. Cl. ............................ 29/840; 29/729; 29/740; 29/833; 29/834; 156/299; 228/6.2
[58] Field of Search .............................. 29/840, 740, 833, 29/834, 729; 156/299; 228/6.2

[56] References Cited

U.S. PATENT DOCUMENTS

| | | |
|---|---|---|
| 4,479,298 | 10/1984 | Hug . |
| 4,512,509 | 4/1985 | Ellis, Jr. et al. . |
| 4,595,794 | 6/1986 | Wasserman . |
| 4,670,981 | 6/1987 | Kubota et al. . |
| 4,733,462 | 3/1988 | Kawantani . |
| 4,872,261 | 10/1989 | Sanyal et al. . |
| 4,893,403 | 1/1990 | Heflinger et al. . |
| 4,956,911 | 9/1990 | Zaremba et al. . |
| 4,985,107 | 1/1991 | Conroy et al. . |
| 5,034,802 | 7/1991 | Liebes, Jr. et al. . |
| 5,046,415 | 9/1991 | Oates . |
| 5,107,759 | 4/1992 | Omori et al. . |
| 5,457,880 | 10/1995 | McKinley et al. . |
| 5,526,974 | 6/1996 | Gordon et al. . |
| 5,535,936 | 7/1996 | Chong et al. . |
| 5,542,457 | 8/1996 | Gordon et al. . |
| 5,611,140 | 3/1997 | Kulesza . |
| 5,658,827 | 8/1997 | Aulicino et al. . |
| 5,742,483 | 4/1998 | Ma et al. . |

FOREIGN PATENT DOCUMENTS

| | | |
|---|---|---|
| 2294905 | 5/1996 | United Kingdom . |

OTHER PUBLICATIONS

U.S. application No. 08/731,488 by Jacks et al.
Letter, David Jacks to Steve Hire, Sep. 14, 1996 (with attached undated press release "Zephyrtronics Wins The Prestigious 1996 Vision Award From SMT Magazine For 'Best New Product'").

*Primary Examiner*—Carl J. Arbes
*Attorney, Agent, or Firm*—Burns, Doane, Swecker & Mathis, L.L.P.

[57] ABSTRACT

An apparatus and method for aligning fine pitch electrical components and for solder paste stenciling includes a template for aligning an electrical component and for aligning a solder stencil. The template has a window with shelves on opposite sides. Tape is adhered to the shelves across the window and is used to secure the template to the desired location on the printed circuit board. The template also includes upright tabs that engage notches in the edges of the stencil for aligning the stencil. A two headed vacuum lifting device is used to lift an aligned component and an aligned stencil from the template. With the template removed from the printed circuit board, the stencil is replaced in the aligned position for solder application. The stencil is removed and the electrical component is placed for soldering.

22 Claims, 7 Drawing Sheets

STENCILING METHOD AND APPARATUS FOR PC BOARD REPAIR

The present invention is directed to a method and apparatus for accurately placing fine pitch electrical components on a printed circuit board, and more particularly, to a method and apparatus for placing fine pitch electrical components on a printed circuit board for rework or repair.

BACKGROUND AND SUMMARY OF THE INVENTION

Fine pitch electrical components are engineered to fit in small spaces on printed circuit boards. One type of fine pitch component is the Quad Flat Pack (QFP), a rectangular component having leads extending from the four sides of the body. QFP's can have 208 leads spaced on a 0.020 inch pitch with 0.010 inch spacing between leads.

Other types are Ball Grid Array (BGA) and Column Grid Array (CGA) components, which have, respectively, a multiplicity of balls or columns on a bottom surface of the body to connect with a printed circuit board.

Because of the very closely spaced leads or connectors, fine pitch electrical components cannot be readily positioned on a printed circuit board by hand. Placement of a fine pitch component is more difficult in rework or repair, when the printed circuit board is already populated with other components or devices. The space between components can be as small as 0.035 inches which makes manipulation of the rework component even more difficult.

Automatic or semiautomatic machines with sophisticated vision systems are available for placing fine pitch components on printed circuit boards. Manual devices using split optic vision systems are also available. Both types of machines are prohibitively expensive for small quantity assembly or repair or rework. In addition, the manual machines do not include solder paste printing capability, and an additional apparatus must be provided for this purpose.

Solder paste screening is the method of choice for providing the proper amount of solder on the printed circuit board. In original assembly work, a stencil is placed over the board and solder is applied to the entire foil pattern at one time. On repair or rework, stenciling is complicated by the components populating the board, which interfere with the placement of the stencil.

The present invention provides a method and an apparatus that overcome the deficiencies in the art. The method and apparatus can be used for low quantity production or prototype work for individual component placement and solder paste application. The invention can also be used for replacement of individual components on a populated printed circuit board in rework or repair.

The apparatus of the invention includes a template that accurately locates the mounting position of the component and the position of a solder paste stencil. The template is made to have substantially the same space footprint as the component which it is used to position and thus can be readily positioned on a populated printed circuit board.

The template includes means for aligning an electrical component, a multiplicity of depressions or holes that receive the pin outs of the component, and means for aligning a stencil on the template, preferably tabs that register with notches on the edges of the stencil.

According to the invention, the template includes a window and shelves formed in a central part for fastening the template to a printed circuit board using tape. The shelves provide a tape adhering location on the template. The window allows for tape adhered to the template to attach to the printed circuit board. By fastening the template in a area within a peripheral outline, the template is readily positionable on a populated board. The shelves are recessed below an upper surface of the template so that tape applied to the template does not interfere with the component being aligned on the template.

According to an alternatively embodiment, the template includes a plate defining diagonally opposite corners of a component pin out pattern connected by a recessed shelf. The template is fixed to a printed circuit board by applying tape across the shelf, within a rectangular outline defined by the template corners. The shelf is recessed to position the tape below an upper surface of the template as in the previous embodiment.

The stencil includes holes for applying solder paste to the printed circuit board, and notches for aligning the stencil with the template.

A pickup device having two heads is used to lift the component and the stencil from the template once they are aligned. According to a preferred embodiment, the pickup device uses vacuum pickup heads. Alternatively, other devices that can lift and hold the component and stencil may be used, for example, a magnetic pickup, a clamping pickup, or pickup using adhesive.

BRIEF DESCRIPTION OF THE DRAWINGS

The invention will be better understood by reference to the following detailed description in conjunction with the appended drawings, in which.

DETAILED DESCRIPTION

Figure 1:
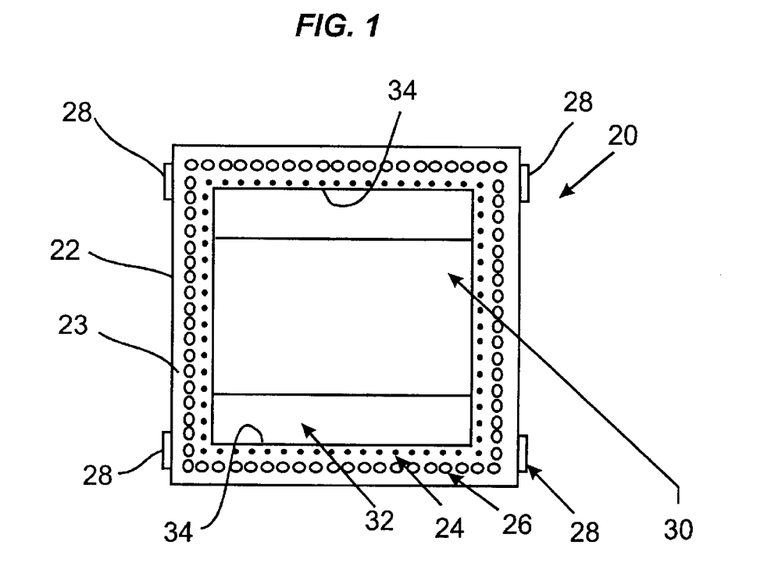
FIG. 1 is a top view of an alignment template for a BGA component in accordance with the invention.
Figure 2:
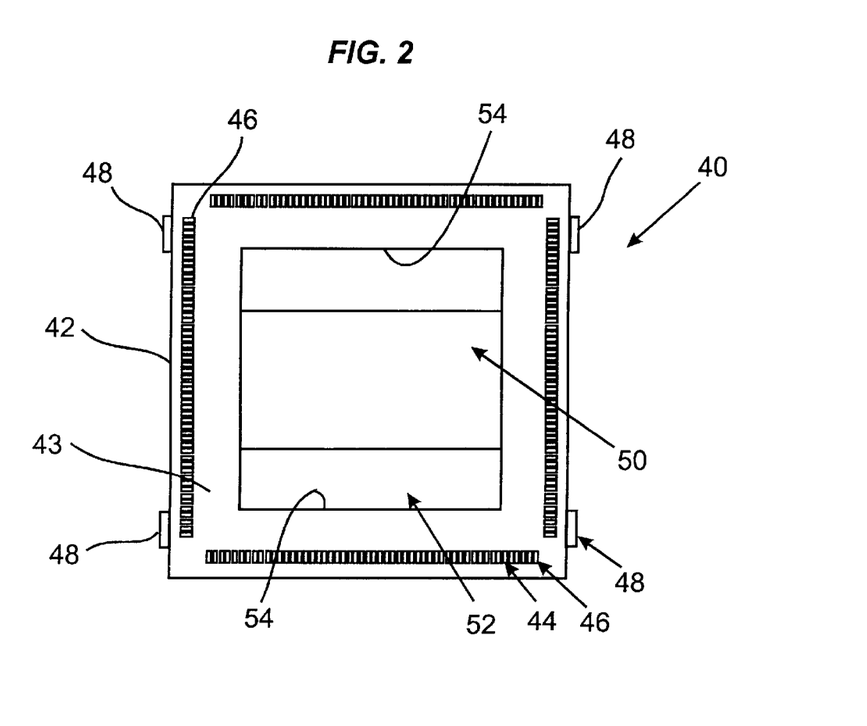
FIG. 2 is a top view of an alignment template for a QFP component.

A device in accordance with the invention for accurately positioning fine pitch electrical components on a printed circuit board includes an alignment template, illustrated in alternative embodiments in FIG. 1 and FIG. 2. The template is positionable on a printed circuit board at a foil pattern location for an electrical component for aligning both an electrical component and a solder paste stencil with the foil pattern. The template 20 in FIG. 1 is for a Ball Grid Array (BGA) and the template 40 of FIG. 2 is for a Quad Flat Pack (QFP) component. The principles and advantages of the invention are the same with either template, as will be understood through the following description.

As explained in greater detail below, according to the method the template is positioned on a printed circuit board to overlay a foil pattern for an electrical component, and the electrical component is placed on the template, thus in alignment with the pattern. The component is then lifted from the template by an indexed lifting device, and a solder stencil is placed on the template and aligned with the foil pattern. The stencil is then lifted from the template, also by an indexed lifting device. The template is removed from the printed circuit board and the stencil is replaced in the aligned location and held down by the lifting device as solder paste is applied to the foil pattern through the stencil. The stencil is then removed and the component replaced in its aligned position. The component and board may then be heated to solder the component in place.

Figure 5:
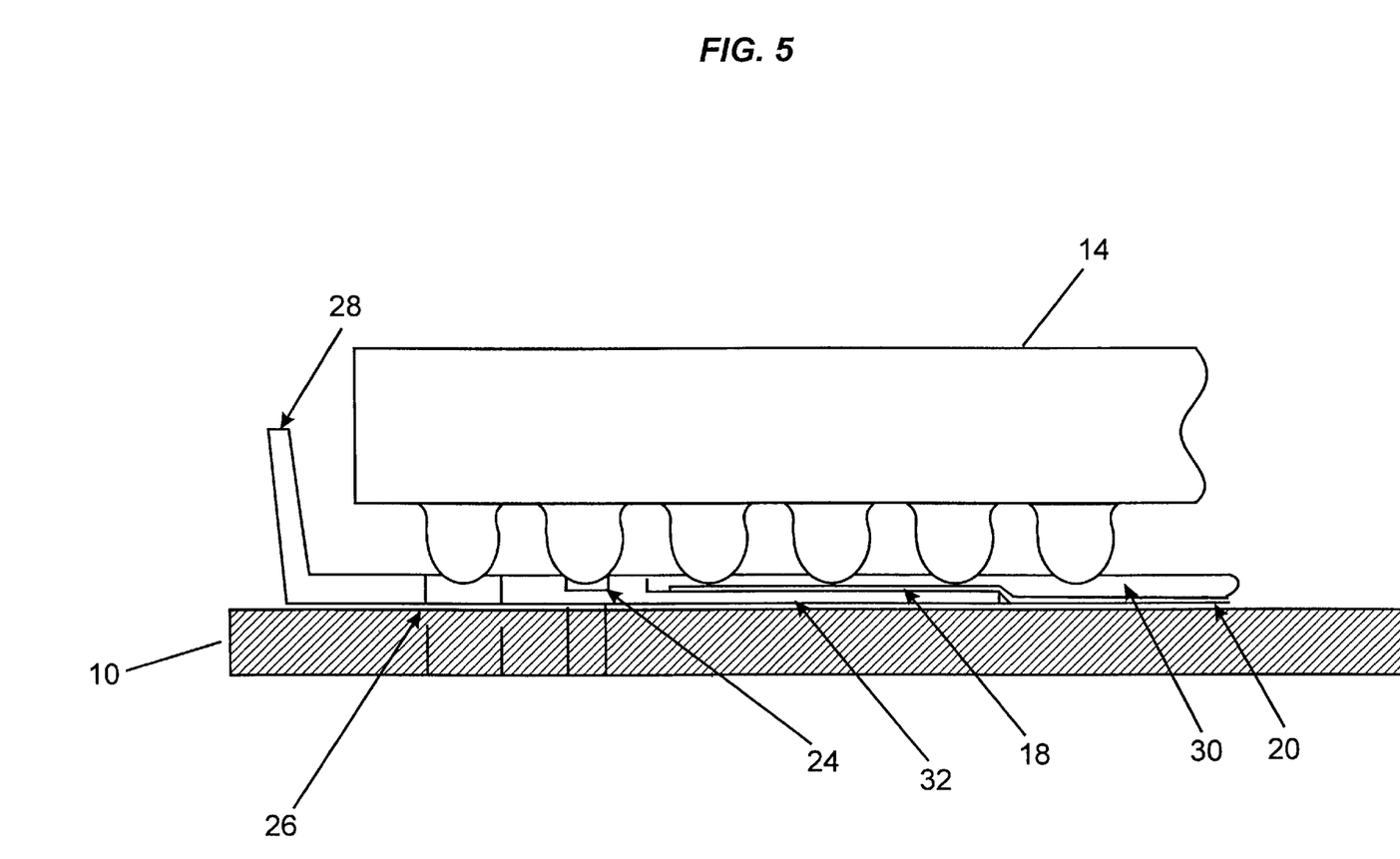
FIG. 5 is sectional view of a template positioned on a printed circuit board for positioning an electrical component.

FIG. 5 is a sectional view of a BGA template 20 positioned on a printed circuit board 10. A BGA electrical component 14 is shown positioned on the template 20.

The template 20, 40 includes a platform 22, 42 that provides a substantially planar upper surface 23, 43 on which an electrical component is placed for alignment positioning. The upper surface 23, 43 includes alignment means, which in the BGA template 20 is a multiplicity of round holes or depressions 24 arranged in a precisely formed pattern corresponding to the foil pattern. The holes 24 allow the lower curved surfaces of the balls of the component to nest, as illustrated in FIG. 5. A template for a Column Grid Array (CGA) component is similar to the BGA template and would have a similar pattern of holes. Because the columns in a CGA component actually insert into the holes, however, the holes in a CGA template would be correspondingly larger than the holes for the BGA template to allow room for the columns and some clearance. With the exception of the size of the holes, the description of the BGA template should be understood to apply to a CGA template. In the QFP template 40 the alignment means is a multiplicity of rectangular closed recesses or depressions 44 in a precisely formed pattern corresponding to the foil pattern which accept the leads of the QFP.

The template 20, 40 also includes sight holes 26, 46 for accurately positioning the template on a printed circuit board at the foil pattern position. The sight holes are aligned with the foil pattern on the printed circuit board, using the unassisted eye or with magnification means. At least two sight holes are provided for accurate positioning, and preferably the template includes at least four sight holes. In the QFP template 40 the sight holes are located at the four corners of the surface 43, and preferably, are provided at the ends of each of the linear arrays of recesses. In the BGA template 20, or a CGA template, a multiplicity of sight holes 26 are provided about the perimeter of the upper surface 23.

The template 20, 40 also include means for aligning a solder paste stencil (illustrated in FIGS. 6 and 7) on the template. The aligning means includes tabs 28, 48 that project upward from the platform 22, 42. At least two tabs, and more preferably four tabs, are positioned on the peripheral edges of the templates. The tabs 28, 48 engage notches in the stencil to align the stencil on the template, which will be further described below. Preferably, the tabs are less than perpendicular to the platform, so that the distance between tabs widens away from the platform, which facilitates positioning the stencil between the tabs.

The template 20, 40 includes a window 30, 50 within the peripheral outline of the template. On opposite sides of the window 30, 50 are shelves 32, 52. The shelves 32, 52 are recessed below the upper surface 23, 43. The window 30, 50 provides a means for fastening the template to a printed circuit board within the peripheral outline of the template.

Thus, the template according to the invention does not require additional space beyond the peripheral outline of the template, making it suitable for use with populated printed circuit boards. Tape 18 (shown in FIG. 5) can be stretched across the window 30, 50 and adhered to the shelves 32, 52. The tape can be trimmed at the edges 34, 54 defined between the shelves 32, 52 and the upper surface 23, 43. The shelves are preferably recessed at least an amount corresponding to a thickness of tape, which is typically about 0.002 inches.

The tape shelves 32, 52 allow the tape to be positioned below the upper surface 23, 43 of the template 20, 40 so that the tape does not interfere with the electrical component 14 being aligned on the template.

The template 20, 40 with tape across the window 30, 50 can be readily placed on a printed circuit board and moved to align the sight holes 26, 46 with the foil pattern on the printed circuit board. When the template is aligned properly, the tape 18 is pressed through the window 30, 50 to fix the template in place (as illustrated in FIG. 5). Preferably, a high tack adhesive tape that does not leave a residue on the board can be used. Other types of tape can, of course, be used, but will require cleaning the printed circuit board after removal of the template and before solder pasting.

As may be understood from FIG. 5, the window 30, 50 permits the template 20, 40 to be formed with a minimal peripheral outline or footprint. The size of the edges beyond the sight and alignment holes is kept to a minimum, which is enough to support the holes and provide clearance between the tabs 28, 48 and a component on the template. As a result, the template 20, 40 is only slightly larger than a component which is positioned by the template. This permits positioning of the template on a populated circuit board.

Figure 3:
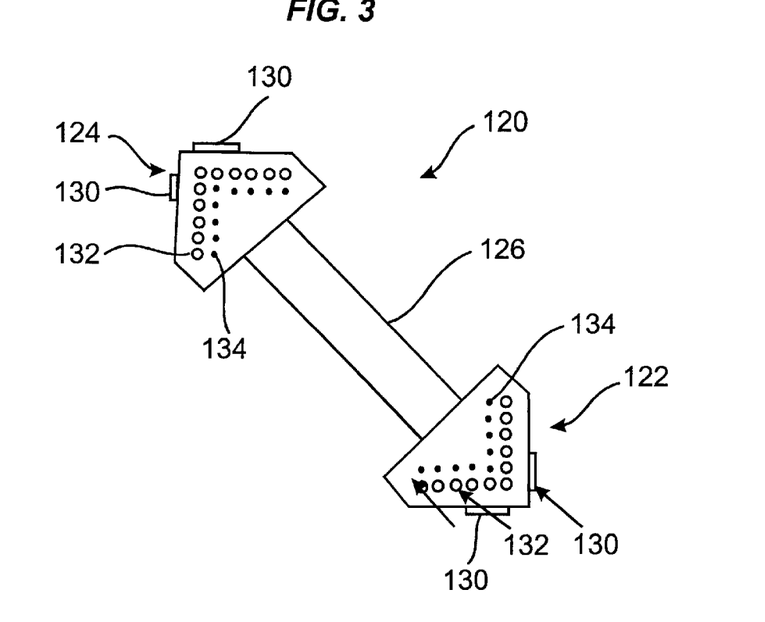
FIG. 3 is an alternative embodiment of a BGA template.
Figure 4:
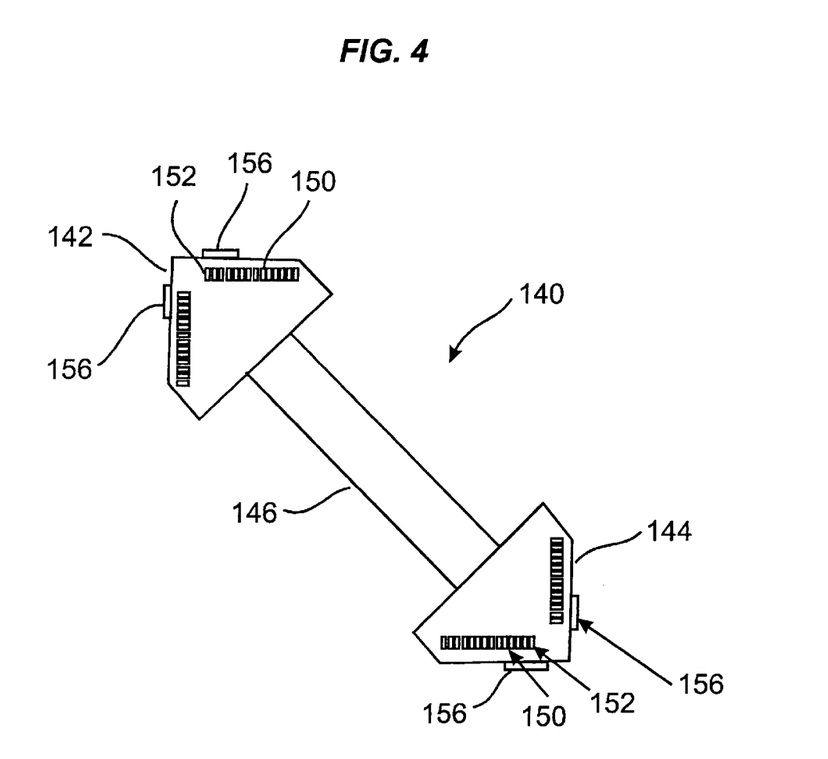
FIG. 4 is an alternative embodiment of a QFP template.

FIGS. 3 and 4 illustrate alternatively embodiments of the templates following the principle of providing fastening means within a peripheral outline of the template. In FIG. 3, a BGA template 120 includes platforms 122, 124 that define diagonally opposite corners of a foil pattern, as may be understood by comparison with FIG. 1. A bridge 126 connecting the platforms 122, 124 is recessed below an upper surface of the platforms, similar to the shelves of the template 20 in FIG. 1. The platforms 122, 124, include stencil aligning tabs 130, sight holes 132 and alignment holes or depressions 134 that function as described above.

FIG. 4 illustrates an alternative QFP template 140 that includes platforms 142, 144 that define diagonally opposite corners of a QFP foil pattern. The platforms 142, 144 are connected by a bridge 146 that is recessed below an upper surface of the platforms. Patterns of depressions 150 for aligning a component are formed on the platforms, and sight holes 152 for aligning the template with a foil pattern on a printed circuit board are included. Tabs 156 project upward from the platforms 142, 144 for positioning and aligning a stencil on the template 140.

Figure 4A:
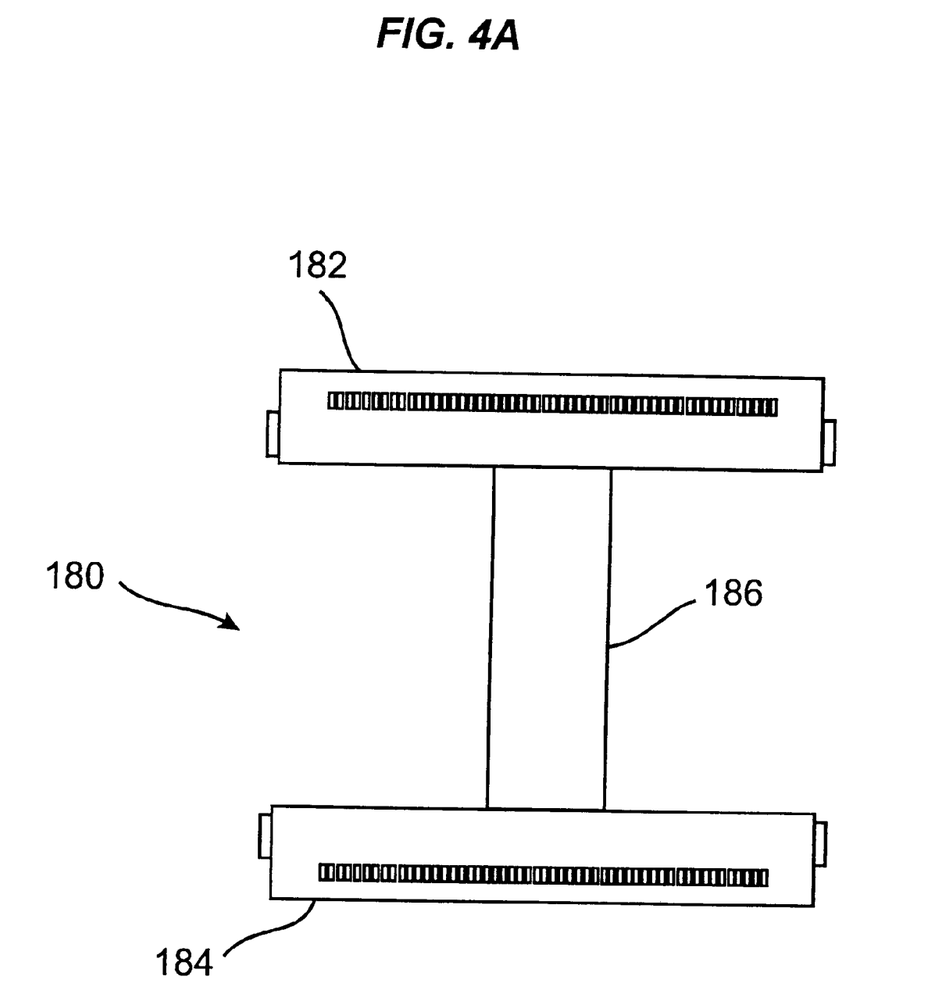
FIG. 4A is another alternative embodiment of a template in accordance with the invention.

Another alternative template 180 based on the bridge design is shown in FIG. 4A. The template 180 is shown with a alignment pattern for a QFP component, but, or course, can be made for other components. The platforms 182, 184 define sides of a foil pattern, and are connected by a bridge 186. Other variations will occur to those of skill in the art.

The templates 120, 140 are fastenable on a printed circuit board in a minimal surface area. As may be understood from the figures, a piece of tape can be fastened across the bridge 126, 146 and taped down on the printed circuit board within a peripheral outline of the template 120, 140.

The template 20, 40 (120, 140) is formed of a durable material that can be formed in a thin structure, such as stainless steel. The template may be conveniently formed by a stamping process, chemical etching, or laser machining, for example.

Figure 6:
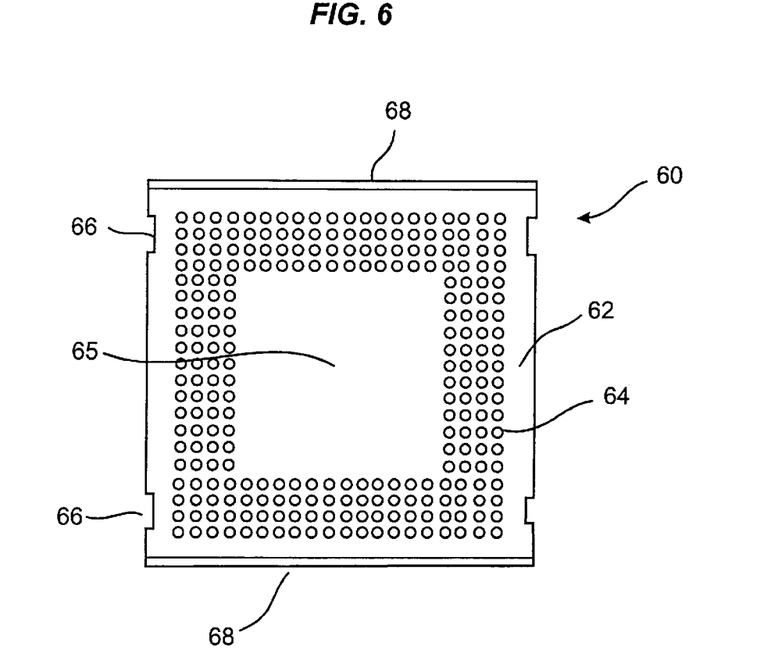
FIG. 6 is a top view of a BGA or CGA solder paste stencil.
Figure 7:
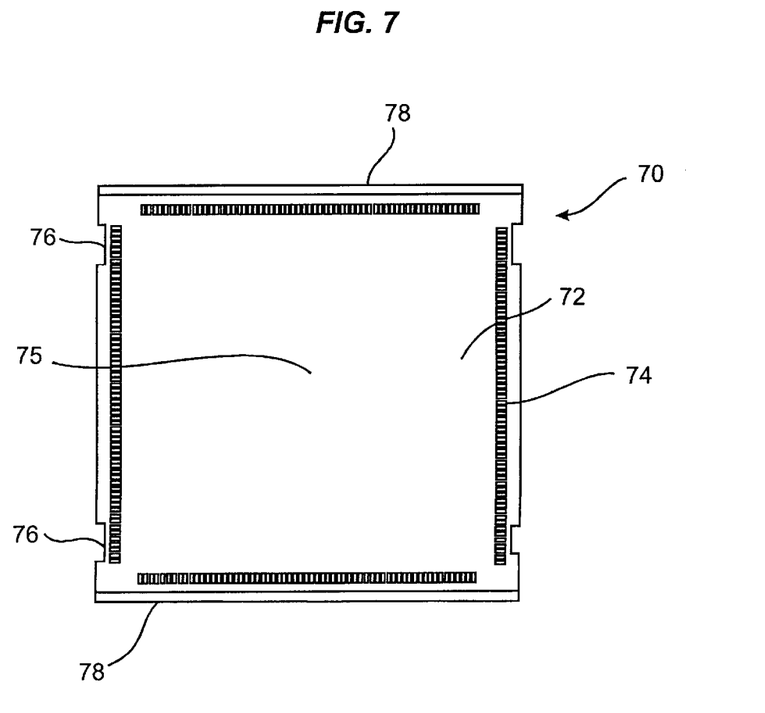
FIG. 7 is a top view of a QFP solder paste stencil.

The template 20, 40 (120, 140) is also used to position a solder paste stencil in alignment with the foil pattern on the printed circuit board. FIG. 6 illustrates a stencil 60 for a BGA or CGA component. FIG. 7 illustrates a stencil 70 for a QFP component. The stencil 60, 70 is made from thin durable material, for example a metal, and preferably stainless steel to avoid corrosion.

The stencil 60, 70 includes a planar surface 62, 72 having a multiplicity of holes 64, 74 for applying solder paste to a printed circuit board. The shape of the holes 64, 74 and the pattern in which the holes are provided correspond to the foil pattern on the printed circuit board for the leads or pin outs of the electrical component. The stencil 60, 70 also includes notches 66, 76 formed on the peripheral edges of the stencil for mating with the tabs 28, 48, 130, 156 (FIGS. 1–4) in the templates. When the stencil 60, 70 is placed on the template the notches 66, 76 receive the tabs in the template to align the stencil on the template.

The stencil 60, 70 also includes dams 68, 78 on the peripheral edges to prevent solder paste from flowing over the edge of the stencil onto the printed circuit board during solder paste application. The dams 68, 78 are formed on at least two sides of the stencil 60, 70, and may be formed on additional sides as desired.

Figure 8:
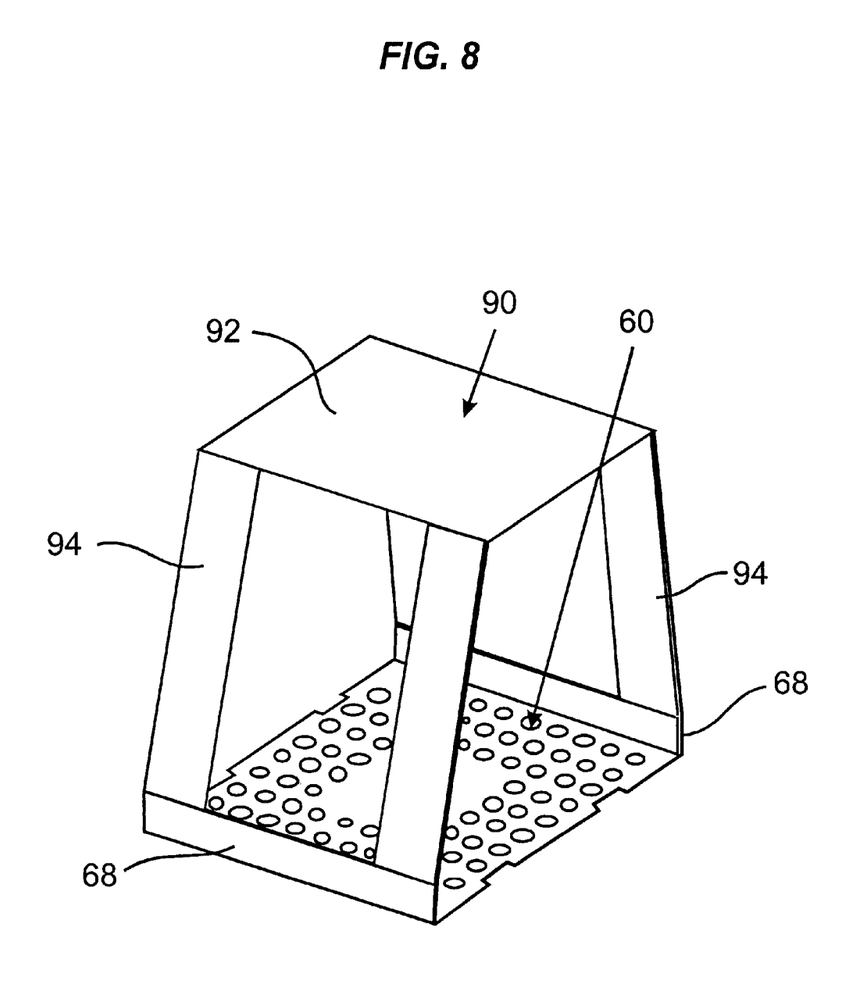
FIG. 8 is a perspective view of a solder stencil with a lifting frame.

A central area 65, 75 of the stencil 60, 70 is solid, that is, without stenciling holes, and is used as a contact area for a lifting device, which is preferably a vacuum head device, described in more detail in connection with FIG. 9. For a QFP component, in which the leads extend laterally from the sides of the component, a relatively large central area is available, as illustrated in FIG. 7. For BGA or CGA components, however, a substantially large portion of the central area, and possibly the entire area, may be taken up by stenciling holes for the connecting balls or columns. This leaves little or no space available for a contact area for a lifting device head. Even if a contact area is available, little clearance space for applying solder around the lifting device head is available. In such circumstances, a frame may be connected to the stencil to provide contact means for a lifting device. FIG. 8 illustrates a BGA/CGA type stencil 60 with a frame 90 attached. The frame 90 includes an upper planar surface 92 supported on the stencil 20 by legs 94 attached to the dams 68. Other suitable frames or structures for contacting a lifting device may also be used. For example, if a clamping lifting device is used rather than a vacuum head device, a simple post device to be grasped by the clamp may be attached to the stencil.

The stencil 60, 70 is preferably shaped to have a slight concave curve on a bottom side, that is, the side that faces the printed circuit board. According to the method, the stencil is placed and held against the printed circuit board during stenciling by the lifting device. The slight concave curvature, with downward pressure applied by the lifting device, forces the entire bottom surface of the stencil into contact with the printed circuit board. This ensures that the solder application holes are properly aligned at the foil pattern so that solder paste is applied accurately through the stencil holes.

Figure 9:
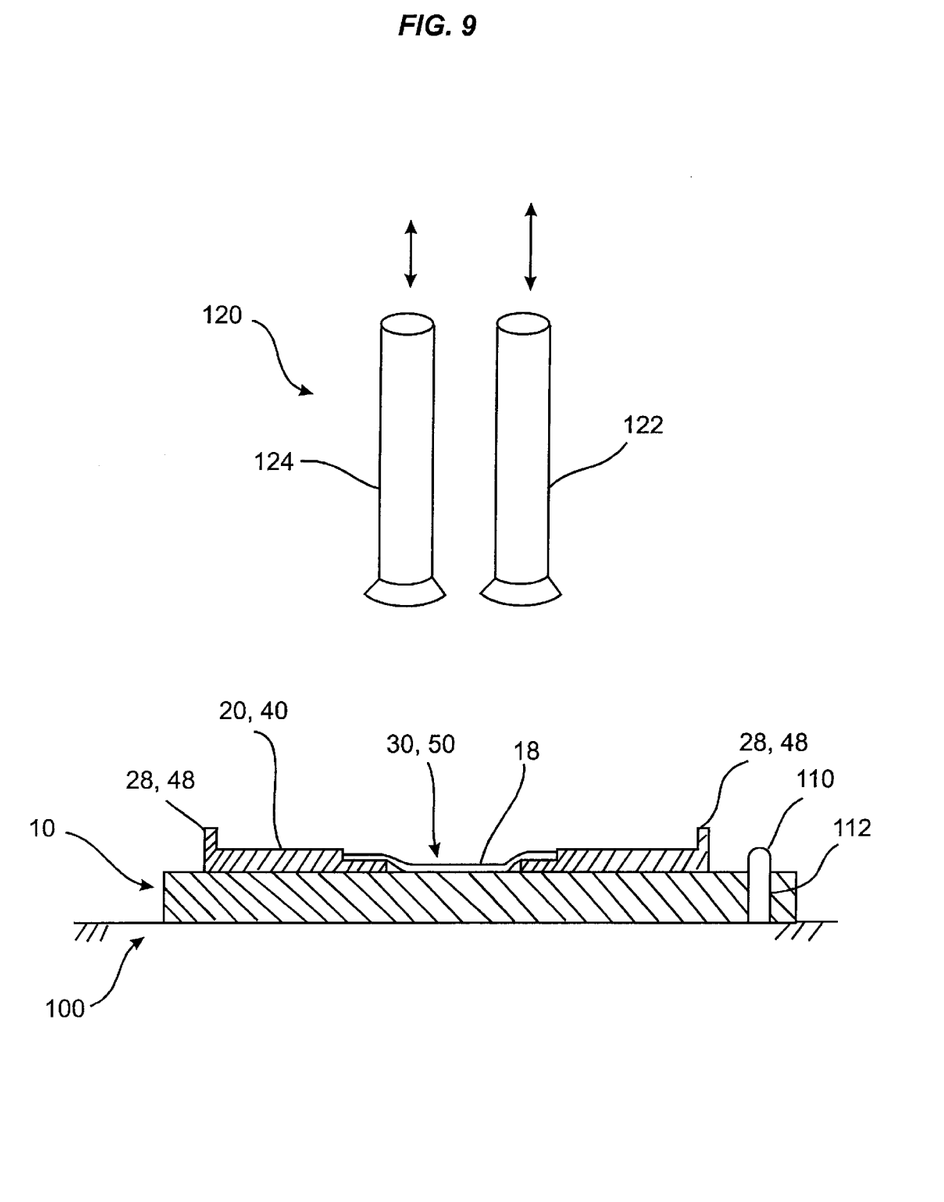
FIG. 9 is a schematic diagram of an apparatus in accordance with the invention including a two-head pickup device.

FIG. 9 illustrates schematically an apparatus and method in accordance with the invention. A printed circuit board 10 is supported on a base 100, which is a flat, stable platform. Registration pins 110 (only one is illustrated) are mounted on the base 100 and insert through registration holes 112 which are commonly provided in printed circuit boards. The pins 110 may be mounted at any convenient place on the base 100 to correspond with the registration holes 112, and serve to hold the printed circuit board in a fixed location. A template is placed on the printed circuit board 10 and aligned with the foil pattern using the sight holes in the template. The tape 18, having previously been applied to the template 20, 40 as described above, is pressed through the window 30, 50 (or across the bridge 126, 146) to secure the template at the proper aligned position on the printed circuit board 10. As will be appreciated, a template in accordance with the invention can be placed on a populated board without difficulty because of the small footprint permitted by the fastening means.

An electrical component 14 is then placed on the template and manipulated so that the leads, balls, or columns (collectively referred to as "pin-outs") fall in the alignment depressions or holes (illustrated in FIG. 5). The component will seat in the holes or depressions and is not easily moved from them, giving a tactile indication that the component is aligned. In addition, a visual indication is noticeable in the uniform border around the component when aligned.

Once the electrical component is aligned on the template a first head 122 of a lifting device 120 is lowered into contact with the component to secure the component for lifting. Preferably, a vacuum head device is used. Alternatively, the pickup head may use a clamping device, a magnetic pickup, or a simple adhesive contact head. Although the heads 122, 124 of the lifting device 120 are shown side by side, this is for the convenience of the illustration. The lifting device 120 preferably will have both heads centered on the template. The component is then lifted from the template on an indexed pathway, that is, a path on which the component is precisely returned to the identical position. A stencil 60, 70 is then placed on the template and registered with the tabs, the template thus aligning the stencil with the foil pattern. A pickup head 124 is then lowered onto and lifts the stencil 60, 70 from the template along an indexed pathway.

At this point, both the stencil and the electrical component are being held above the printed circuit board. The template is removed from the printed circuit board 10. This step may require removing the printed circuit board 10 from the base 100, in which case the registration pins 110 ensure that the printed circuit board is replaced in the exact position.

With the template removed, and the printed circuit board in position, the stencil is then replaced at the aligned position on the printed circuit board by the lifting device 120. The second pickup head 124 is caused to provide a slight downward pressure on the stencil so that no movement occurs during application of the solder paste. The lifting device may include a locking mechanism to secure the second pickup head in a position to apply a slight pressure. Solder paste is then applied through the stenciling holes, using a wiping blade or squeegee to force the paste through the holes and keep that paste to the thickness of the holes. A visual check is made to confirm that solder has been applied to all of the holes. The stencil is then removed with a quick lifting motion to break the stencil from the solder paste and leave solder paste on the foil pads. The stencil is set aside for cleaning.

The component is then lowered by the lifting device 120 into the aligned position, and the pin-outs are seated into the pasted pads in precise alignment. The pickup head is released and moved away from the component. The board and component may then be heated to solder the pin-outs to the board by any convenient means.

The invention has been described in terms of preferred principles, structure and steps, however, those of skill in the art will appreciate that the invention may be practiced other than as described and substitutions and equivalents may be used without departing from the scope of the invention as defined in the following claims.

What we claim is:

1. A method for accurately placing a fine-pitch component on a printed circuit board for solder paste soldering, comprising the steps of:

placing a template on a printed circuit board in alignment with a component location;

fixing the template to the printed circuit board with tape adhering to the template and projecting through a window in the template;

placing a component on the template in registration with component alignment means;

lifting the component on a first fixed pathway;

placing a solder paste stencil on the template in alignment with stencil alignment means;

lifting the stencil on a second fixed pathway; removing the template;

lowering the stencil along the second fixed pathway to the aligned position on the printed circuit board;

applying solder paste to the printed circuit board through the stencil;

removing the stencil from the printed circuit board; and lowering the component along the first fixed pathway to the aligned position on the printed circuit board.

2. The method as claimed in claim 1, further comprising the steps of adhering tape to the template across the window, and trimming the tape at shelves on opposite sides of the window.

3. A device for accurately positioning fine pitch electrical components on a printed circuit board, comprising:

an alignment template having a plurality of sight holes for aligning the template with a printed circuit board pattern, a window for taping the template to a printed circuit board, shelves recessed below an upper surface of the template and disposed on opposite sides of the window, and alignment means for aligning a component with the template.

4. The device as claimed in claim 3, further comprising a solder stencil having a plurality of stenciling holes in a pattern corresponding to a pin out pattern of a component and means for aligning the stencil with the template.

5. A device for accurately positioning fine pitch electrical components on a printed circuit board, comprising:

an alignment template having two platforms, each platform having a plurality of sight holes for aligning the template with a printed circuit board pattern, a bridge connecting the platforms, the bridge recessed below upper surfaces of the platforms, and alignment means for aligning a component with the platforms.

6. The device as claimed in claim 5, wherein the platforms define diagonally opposite corners of a foil pattern.

7. The device as claimed in claim 5, wherein the platforms define opposite sides of a foil pattern.

8. The device as claimed in claim 5, further comprising a solder stencil having a plurality of stenciling holes in a pattern corresponding to a pin out pattern of a component and means for aligning the stencil with the template.

9. A device for accurately positioning fine-pitch components on a printed circuit board, comprising:

an alignment template having a plurality of sight holes for aligning the template with a printed circuit board pattern, a window for taping the template to a printed circuit board, and alignment means for aligning a component with the template; and a solder stencil having a plurality of stenciling holes in a pattern corresponding to a pin out pattern of a component and means for aligning the stencil with the template.

10. The device as claimed in claim 9, wherein the template includes shelves formed on opposite sides of the window and recessed below an upper surface of the template.

11. The device as claimed in claim 9, wherein the template has an outer peripheral size that corresponds substantially to an outer peripheral size of an electrical component.

12. The device as claimed in claim 9, wherein the alignment means on the template includes a plurality of recesses in a pattern corresponding to a pin out pattern of an electrical component.

13. The device as claimed in claim 9, wherein the alignment means on the template includes a plurality of holes in a pattern corresponding to a pin out pattern of an electrical component.

14. The device as claimed in claim 9, wherein the template further includes stencil aligning means.

15. The device as claimed in claim 14, wherein the stencil aligning means includes at least two tab members projecting upward from a top surface of the template, and wherein the means for aligning the stencil with the template includes notches formed in outer edges of the stencil for engaging the at least two tab members.

16. The device as claimed in claim 9, wherein the stencil has a curvature that is concave on a bottom surface.

17. The device as claimed in claim 9, wherein the stencil includes a frame supported above the stencil which is engageable by a lifting device.

18. The device as claimed in claim 9, further comprising means for lifting and accurately replacing an electrical component.

19. The device as claimed in claim 18, wherein said means for lifting is a vacuum head pickup device having an indexing mechanism for moving a lifted component on a fixed path.

20. The device as claimed in claim 9, further comprising means for lifting and accurately replacing the solder stencil.

21. The device as claimed in claim 20, wherein the means for lifting is a vacuum head pickup device having an indexing mechanism for moving a lifted component on a fixed path.

22. The device as claimed in claim 9, further comprising a two-headed vacuum pickup device having an indexing mechanism for lifting and accurately replacing an electrical component and the solder stencil.

* * * * *